(12) United States Patent
Yamauchi et al.

(10) Patent No.: US 8,679,286 B2
(45) Date of Patent: *Mar. 25, 2014

(54) CATALYST-AIDED CHEMICAL PROCESSING METHOD

(75) Inventors: Kazuto Yamauchi, Osaka-fu (JP); Yasuhisa Sano, Osaka-fu (JP)

(73) Assignee: Ebara Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/449,622

(22) Filed: Apr. 18, 2012

(65) Prior Publication Data
US 2012/0241087 A1    Sep. 27, 2012

Related U.S. Application Data

(62) Division of application No. 12/832,194, filed on Jul. 8, 2010, now abandoned, which is a division of application No. 11/401,315, filed on Apr. 11, 2006, now Pat. No. 7,776,228.

(51) Int. Cl.
*C23F 1/08*    (2006.01)

(52) U.S. Cl.
USPC ............................................ 156/345.12

(58) Field of Classification Search
USPC ............................................ 156/345.12
See application file for complete search history.

(56) References Cited

U.S. PATENT DOCUMENTS

| | | | |
|---|---|---|---|
| 3,669,774 A | 6/1972 | Dismukes | |
| 4,772,496 A | 9/1988 | Maeda et al. | |
| 5,537,508 A | 7/1996 | Ebbing et al. | |
| 6,027,987 A | 2/2000 | Yamazaki et al. | |
| 6,030,425 A | 2/2000 | Hata | |
| 6,383,065 B1 | 5/2002 | Grumbine et al. | |
| 6,420,092 B1 | 7/2002 | Yang et al. | |
| 6,547,644 B1 * | 4/2003 | Yamada et al. | 451/36 |
| 7,029,508 B2 | 4/2006 | Scott et al. | |
| 7,094,692 B2 | 8/2006 | Horibe et al. | |
| 7,135,414 B2 | 11/2006 | Matsumura et al. | |
| 2001/0023986 A1 | 9/2001 | Mancevski | |
| 2002/0167025 A1 | 11/2002 | Nagao et al. | |

(Continued)

FOREIGN PATENT DOCUMENTS

| | | |
|---|---|---|
| JP | 1-125829 | 5/1989 |
| JP | 2-25745 | 6/1990 |

(Continued)

OTHER PUBLICATIONS

Machine Generated English Translation of JP 2006-121111 published by May 11, 2006.*

*Primary Examiner* — Sylvia R MacArthur
(74) *Attorney, Agent, or Firm* — Wenderoth, Lind & Ponack, L.L.P.

(57) ABSTRACT

A catalyst-aided chemical processing method is a novel processing method having a high processing efficiency and suited for processing in a space wavelength range of not less than several tens of μm. The catalyst-aided chemical processing method comprises: immersing a workpiece in a processing solution in which a halogen-containing molecule is dissolved, said workpiece normally being insoluble in said processing solution; and bringing a platinum, gold or ceramic solid catalyst close to or into contact with a processing surface of the workpiece, thereby processing the workpiece through dissolution in the processing solution of a halogenide produced by chemical reaction between a halogen radical generated at the surface of the catalyst and a surface atom of the workpiece.

4 Claims, 11 Drawing Sheets

(56) References Cited

U.S. PATENT DOCUMENTS

| | | |
|---|---|---|
| 2003/0113521 A1 | 6/2003 | Nishinaka et al. |
| 2004/0009674 A1 | 1/2004 | Lee et al. |
| 2004/0023610 A1 | 2/2004 | Hu et al. |
| 2004/0159558 A1 | 8/2004 | Bunyan et al. |
| 2004/0185323 A1 | 9/2004 | Fowler et al. |
| 2005/0101228 A1 | 5/2005 | Prasad |
| 2005/0151456 A1 | 7/2005 | Yoon et al. |
| 2005/0224779 A1 | 10/2005 | Wang et al. |
| 2006/0162260 A1 | 7/2006 | Nho et al. |
| 2008/0073222 A1 | 3/2008 | Yamauchi et al. |
| 2010/0147463 A1* | 6/2010 | Yamauchi et al. ........ 156/345.12 |
| 2012/0001193 A1* | 1/2012 | Sano et al. ........................ 257/76 |
| 2012/0241087 A1* | 9/2012 | Yamauchi et al. ........ 156/345.12 |

FOREIGN PATENT DOCUMENTS

| | | |
|---|---|---|
| JP | 6-44989 | 6/1994 |
| JP | 7-16870 | 3/1995 |
| JP | 2962583 | 8/1999 |
| JP | 3069271 | 5/2000 |
| JP | 2000-167770 | 6/2000 |
| JP | 2002-346915 | 12/2002 |
| JP | 2006121111 A * | 5/2006 |

* cited by examiner

X-Slope

PV 4.72nm

RMS 0.63nm

64µm × 48µm

500nm × 500nm

PV 3.42nm

RMS 0.46nm

PV 8.70nm

RMS 1.33nm

64 μm × 48 μm

500nm × 500nm

PV 2.49nm

RMS 0.22nm

X-Slope

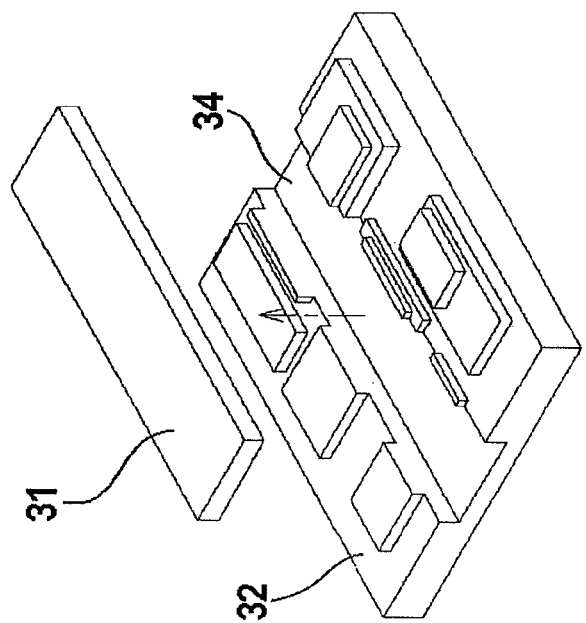
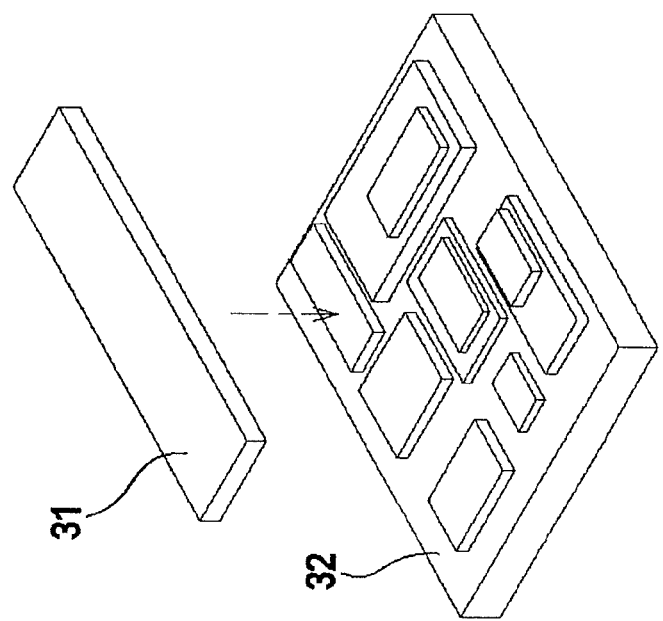

CATALYST-AIDED CHEMICAL PROCESSING METHOD

This application is a Divisional of U.S. application Ser. No. 12/832,194, filed Jul. 8, 2010 now abandoned, which is a Divisional of U.S. application Ser. No. 11/401,315, filed Apr. 11, 2006, now U.S. Pat. No. 7,776,228.

BACKGROUND OF THE INVENTION

1. Field of the Invention

The present invention relates to a catalyst-aided chemical processing method, and more particularly to a catalyst-aided chemical processing method for processing a workpiece by using an active species which is generated by dissociating a molecule in a processing solution with a catalyst.

2. Description of the Related Art

Mechanical processing methods have long been used in various fields. A mechanical polishing method, for example, involves pressing a tool against a surface to be processed so as to process the surface by creating defects in the surface and taking away surface atoms through a mechanical action. Such a mechanical polishing method causes damage to a crystal lattice and, in addition, can hardly provide a high-precision processed surface. In order to process a workpiece with high precision, it is necessary to use a chemical processing method which can process the workpiece without producing a lattice defect in it.

A processing method called EEM (elastic emission machining) is known which involves allowing a suspension of ultrafine powder to flow along a processing surface of a workpiece so as to bring the ultrafine powder into contact with the processing surface, without applying a substantial load on it, and processes the processing surface by removing surface atoms of the processing surface on the order of atomic unit through an interaction (sort of chemical bonding) between the ultrafine powder and the processing surface (Japanese Patent Laid-Open Publication No. 2000-167770 and Japanese Patent Publications Nos. 2-25745, 7-16870 and 6-44989). Further, plasma CVM (chemical vaporization machining) has been proposed which is a processing method comprising supplying a neutral radical, which has been produced by decomposition of a reactive gas caused by high-voltage application to a processing electrode, to a processing surface of a workpiece while moving the processing electrode relative to the processing surface, thereby processing the processing surface through vaporization and removal of a volatile compound produced by a radical reaction between the neutral radical and an atom or a molecule of the processing surface (Japanese Patent No. 2962583). Upon the processing, the processing time is numerically controlled based on processing time-processing amount correlation data, determined by the type of the reactive gas and the material of the workpiece, and also on coordinate data regarding a pre-processing surface and an intended post-processing surface and according to the coordinate difference. A high-efficiency processing method, utilizing a high-density radical reaction, has also been proposed which involves rotating a rotary electrode at a high speed to bring in a gas with a surface of the rotating electrode, thereby creating a flow of the gas that passes through a processing gap (Japanese Patent No. 3069271).

The above-described EEM and plasma CVM are both excellent chemical processing methods. The EEM method can provide a flat processed surface at an atomic level. High-efficient processing, comparable to mechanical processing, can be effected with high precision by plasma CVM.

As will be appreciated from the processing principle of EEM, it is possible with EEM to obtain a very flat processed surface for a high-frequency space wavelength. In EEM, fine particles are supplied by ultrapure water to a processing surface of a workpiece, and processing progresses through chemical bonding between atoms of surfaces of the fine particles and atoms of the processing surface. The surfaces of the fine particles constitute a very flat surface and the flat surface is considered to be transferred as a base surface to the processing surface. It is therefore possible to obtain a flat processed surface of an atomic order without disordering atomic arrangement. Because of the processing principle, however, it is difficult with EEM to flatten a processing surface for a space wavelength range of not less than several tens of µm.

Because of the use of an active radical, plasma CVM is a highly-effective processing method. Plasma CVM utilizes a chemical reaction between a neutral radical in plasma and a surface of a workpiece. In particular, processing is carried out by generating high-density plasma in a high-pressure atmosphere of 1 atom and causing a neutral radical generated in the plasma to act on an atom of a surface of a workpiece to convert the atom into a volatile substance. Plasma CVM can thus process a processing surface with a high processing efficiency, comparable to conventional mechanical processing, without entailing disorder of atomic arrangement in the processing surface. With no base surface, however, the processing is likely to be affected by the plane index of the processing surface.

SUMMARY OF THE INVENTION

It is an object of the present invention to solve the above problems in the prior art and provide a novel processing method having a high processing efficiency and suited for processing in a space wavelength range of not less than several tens of µm. The processing method should be a chemical processing method from a crystallographical viewpoint, because a mechanical processing method entails a production with a lattice defect in a surface of a workpiece, which makes it difficult to process the workpiece with high precision. The present invention, therefore, utilizes the well-known principle of transferring a base surface through a chemical reaction. It is also important that a base surface not change, because if a base surface changes, the processing surface of a workpiece also changes with the progress of processing. Accordingly, the present invention offers a catalyst-aided chemical processing method which entails no change of base surface and is capable of chemical reaction through a catalytic action.

In order to achieve the above object, the present invention provides a catalyst-aided chemical processing method comprising: immersing a workpiece in a processing solution in which a halogen-containing molecule is dissolved, said workpiece normally being insoluble in said processing solution; and bringing a platinum, gold or ceramic solid catalyst close to or into contact with a processing surface of the workpiece, thereby processing the workpiece through dissolution in the processing solution of a halogenide produced by chemical reaction between a halogen radical generated at the surface of the catalyst and a surface atom of the workpiece.

Preferably, the halogen-containing molecule is hydrogen halide, and the hydrogen halide is dissociated at the surface of the catalyst to generate the halogen radical. The hydrogen halide preferably is hydrogen fluoride or hydrogen chloride.

In a preferred aspect of the present invention, the catalyst has or provides a processing base surface, and the configuration or pattern of the base surface is transferred to the processing surface of the workpiece.

In a preferred aspect of the present invention, the processing is carried out by using a processing tool comprising a synthetic resin base and a plating or coating film of said catalyst provided on a surface of the synthetic resin base.

In a preferred aspect of the present invention, the processing is carried out by using a processing tool comprising a mixture of a synthetic resin base and powder of said catalyst, with part of the catalyst powder being exposed on a surface of the synthetic resin base.

In a preferred aspect of the present invention, the processing is carried out by using either a processing tool comprising a non-woven fabric and powder of said catalyst carried in the interstices of the non-woven fabric or a processing tool comprising a non-woven fabric composed of fibers plated or coated with said catalyst.

In a preferred aspect of the present invention, the processing is carried out by dispersing said catalyst in a fine powder form in the processing solution and supplying the fine catalyst powder to the processing surface of the workpiece by a flow of the processing solution.

The catalyst-aided chemical processing method of the present invention thus uses a platinum, gold or ceramic solid catalyst for a processing base surface, and processes a workpiece by generating a halogen radical through dissociation of a halogen-containing molecule, dissolved in the processing solution, at the surface of the catalyst, and dissolving in the processing solution a halogenide produced by chemical reaction between the halogen radical and a surface atom of the workpiece close to or in contact with the catalyst. A hydrogen halide acid, in which a workpiece normally is insoluble, may therefore be used as the processing solution. The halogen radical, generated at the surface of the catalyst, rapidly becomes inactive as it leaves the surface of the catalyst. Thus, the halogen radical exists only on or in the vicinity of the catalyst surface which serves as a base surface, whereby processing can be effected under spatially-controlled conditions.

High-efficient processing is possible when using, as the hydrogen halide, hydrogen fluoride or hydrogen chloride which contains fluorine or chlorine having a strong chemical reactivity. The precision of a processed surface depends on the precision of a catalyst surface which serves as a base surface. Accordingly, a surface of a workpiece can be processed with high precision by preparing a high-precision catalyst surface. When a pattern is formed with high precision on the catalyst surface, the pattern can be transferred to the surface of the workpiece, with a raised portion of the pattern being transferred to form a recess in the workpiece surface.

The processing may be carried out by using, for example, a processing tool comprising a synthetic resin base and a plating or coating film of the catalyst provided on a surface of the synthetic resin base, a processing tool comprising a mixture of a synthetic resin base and powder of the catalyst, with part of the catalyst powder being exposed on a surface of the synthetic resin base, a processing tool comprising a non-woven fabric and powder of the catalyst carried in the interstices of the non-woven fabric, or a processing tool comprising a non-woven fabric composed of fibers plated or coated with the catalyst. The use of such a processing tool can provide a processed surface having the similar configuration to that provided by conventional polishing or lapping.

The processing may also be carried out by dispersing the catalyst in the form of fine powder in the processing solution and supplying the catalyst powder to a processing surface of a workpiece by a flow of the processing solution. This manner of processing can provide a high-precision processed surface comparable to that provided by EEM.

The catalyst-aided chemical processing method of the present invention, because of being a chemical processing utilizing a processing base surface, is suited for processing in a space wavelength range of not less than several tens of µm, which processing has been difficult with EEM or plasma CVM. The present processing method can process SiC, of course, and can also process with high precision those materials such as SiC, ceramics, sapphire and ruby which have hitherto been difficult to process, and could therefore be used in the field of semiconductor manufacturing.

BRIEF DESCRIPTION OF THE DRAWINGS

FIGS. 12A and 12B are conceptual diagrams illustrating transfer of the configuration or pattern of a base surface of a catalyst to a processing surface of a workpiece, as effected by processing according to the present invention, FIG. 12A showing the processing surface before processing and FIG. 12B showing the processing surface after processing.

DETAILED DESCRIPTION OF THE PREFERRED EMBODIMENTS

The present invention will now be described in detail with reference to preferred embodiments. The processing principle of the present invention consists in immersing a workpiece and a catalyst in a processing solution, bringing the catalyst close to or into contact with the workpiece, and processing the workpiece by an active species generated from a molecule in the processing solution, adsorbed on the catalyst.

In particular, the catalyst-aided chemical processing method of the present invention comprises: immersing a workpiece in a processing solution in which a halogen-containing molecule is dissolved, said workpiece normally being insoluble in said processing solution; and bringing a platinum, gold or ceramic solid catalyst close to or into contact with a processing surface of the workpiece, thereby processing the workpiece through dissolution in the processing solution of a halogenide produced by chemical reaction between a halogen radical generated at the surface of the catalyst and a surface atom of the workpiece. Though the halogen-containing molecule preferably is hydrogen halide, a molecule having such a chemical bond as C—F, S—F, N—F, C—Cl, S—Cl, N—Cl, or the like, can also be used.

An aqueous solution, in which a hydrogen halide molecule is dissolved, is herein referred to as hydrogen halide acid. Examples of the halogen include fluorine (F), chlorine (Cl), bromine (Br), and iodine (I). Since the chemical reactivity decreases with the increase in the atomic number, hydrofluoric acid (HF solution) or hydrochloric acid (HCl solution) is preferred as a processing solution for use in practical processing.

Fluorine has the strongest chemical reactivity among non-metal elements, and directly reacts with almost all elements. Chlorine is chemically very active, and reacts with water, organic compounds and many metals. When an HF solution or HCl solution is used as the processing solution, the material of the workpiece must be one which is normally insoluble in the HF or HCl solution or one which has a solubility but is virtually insoluble in the solution within the processing time.

A platinum, gold or ceramic solid catalyst, which promotes the reaction of oxidizing hydrogen and taking out hydrogen ion and an atom, is used as the catalyst.

Figure 1A:
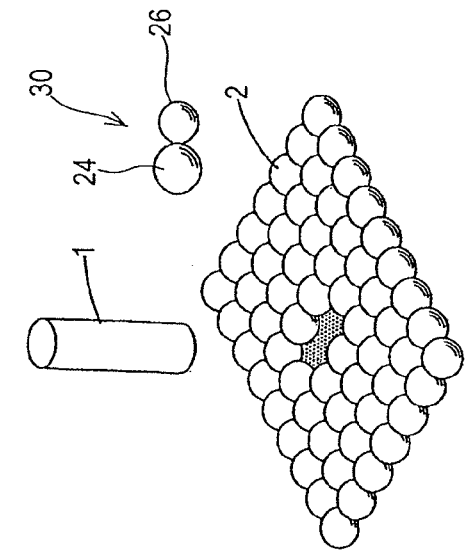
FIGS. 1A through 1C are conceptual diagrams illustrating the catalyst-aided chemical processing method of the present invention, FIG. 1A showing a catalyst and a processing surface of a workpiece, the catalyst having been brought close to or into contact with the processing surface, FIG. 1B illustrating generation of an active F radical by dissociation of an HF molecule in an HF solution into H and F in the vicinity of the catalyst, and FIG. 1C illustrating progress of processing through chemical reaction between the F radical and the processing surface.
Figure 1B:
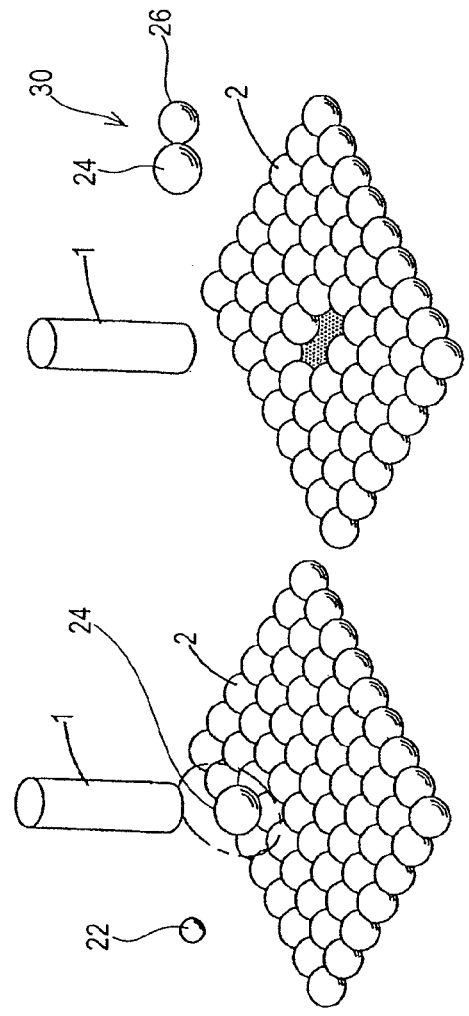
Figure 1C:
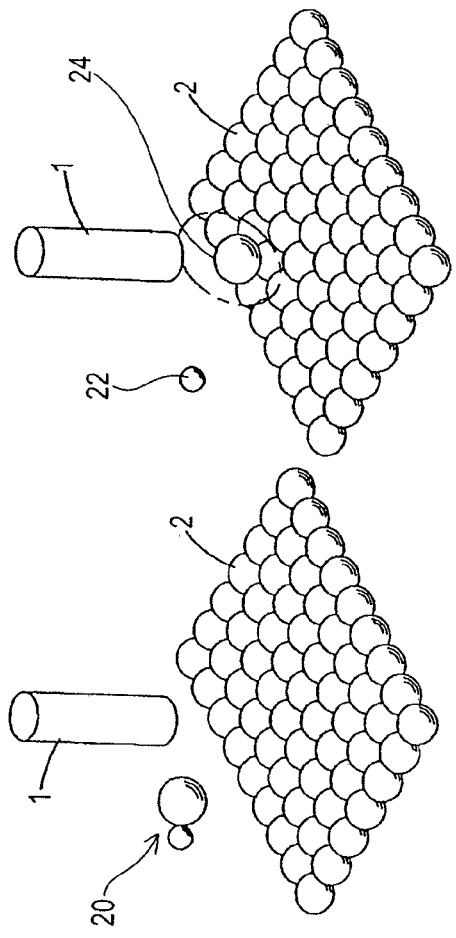

FIGS. 1A through 1C are conceptual diagrams illustrating processing according to the present invention. As shown in FIGS. 1A through 1C, a platinum catalyst 1 is brought closed to or into contact with a processing surface 2 of a workpiece. Taking as an example the use of an HF solution as a processing solution, an HF molecule 20 in the HF solution is dissociated into hydrogen ion 22 and an active F radical 24 in the vicinity of the platinum catalyst 1 (see FIGS. 1A and 1B). Processing progresses through dissolution in the HF solution of a halogenide 30 produced by chemical reaction between the F radical 24 and an atom 26 of the processing surface 2 (see FIG. 1C). At a point distant from the catalyst 1, an F radical 24 reacts with a hydrogen ion 22 to form an inactive HF molecule. The present catalyst-aided chemical processing method can thus be a chemical processing method with which processing progresses only beneath the base surface, i.e. the lower surface of the catalyst 1.

The catalyst-aided chemical processing method of the present invention has the following characteristics: (1) A reactive species is produced only on a base surface; (2) the reactive species becomes inactive when it leaves the base surface; and (3) the physical properties of the base surface do not change over a long period of time.

These characteristics of the present processing method offer the following advantages: Since "a reactive species is produced only on a base surface", unlike chemical etching, it becomes possible to process a processing surface of a workpiece without being influenced by the plane index of the processing surface. Since "the reactive species becomes inactive when it leaves the base surface", the base surface can be transferred to the processing surface. Accordingly, as with EEM, flattening of the processing surface at an atomic level can be expected. Furthermore, since "the physical properties of the base surface do not change over a long period of time", the processing surface does not change even when the base surface is transferred and the processing progresses. With such advantages, the present catalyst-aided chemical processing method can be an efficient ultra-precision processing method.

Figure 2A:
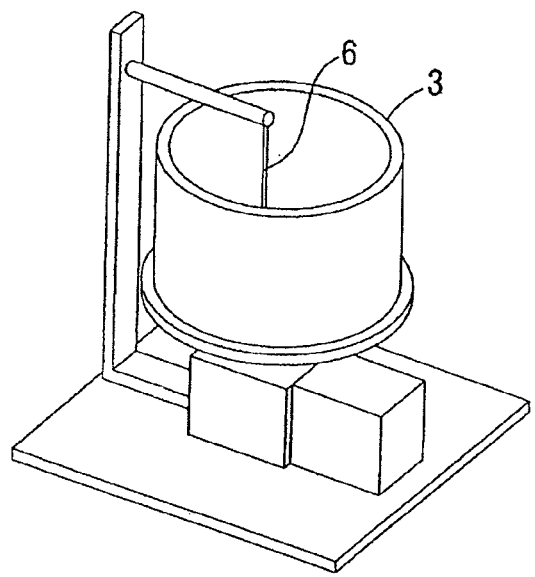
FIG. 2A is a schematic perspective view of a processing apparatus for basic experiment.
Figure 2B:
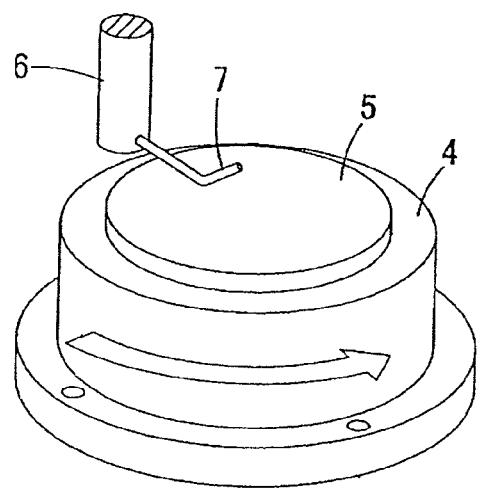
FIG. 2B is an enlarged perspective view of the main portion of the processing apparatus.

In order to confirm the processing principle of the catalyst-aided chemical processing method of the present invention, a processing apparatus for basic experiment was fabricated. FIGS. 2A and 2B show schematic views of the processing apparatus. A sample stage 4, provided with a vertical rotating shaft, was provided at the bottom of a processing vessel 3, an SiC wafer 5 as a sample was fixed on the upper surface of the sample stage 4, and a J-shaped bent platinum wire 7, mounted to the lower end of a support rod 6 and disposed above the Sic wafer 5, was brought into contact with the upper surface of the SiC wafer 5 such that the bend of the wire 7 makes point contact with an eccentric point in the upper surface of the SiC wafer 5. The processing vessel 3 was filled with an HF solution. Because of the use of HF solution, those portions of the apparatus, which are to contact the solution, are made of polytetrafluoroethylene (PTFE). Processing of the sample was carried out while rotating the sample stage 4 by a motor and continually supplying the HF solution to the processing site.

The processing conditions are shown in Table 1 below.

TABLE 1

| Processing solution | 50% HF solution |
|---|---|
| Catalyst | Pt |
| Workpiece | SiC |
| Rotational speed | 1.6 rpm |
| Processing time | 300 min |

Figure 3A:
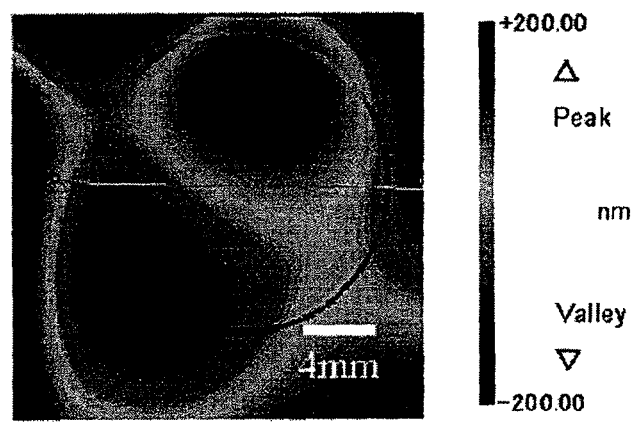
FIG. 3A shows the surface irregularities distribution including a ring-shaped processing mark observed under a Michelson-type phase-shifting interference microscope.
Figure 3B:
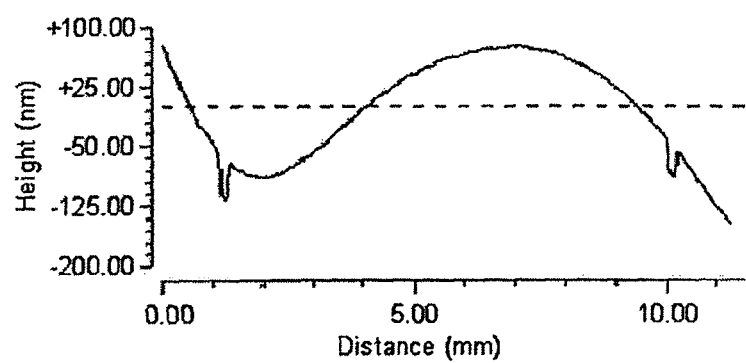
FIG. 3B shows a line distribution along one diameter of the processing mark.

The results of processing are shown in FIGS. 3A and 3B. FIG. 3A shows surface irregularities distribution including a ring-shaped processing mark observed under a Michelson-type phase-shifting interference microscope, and FIG. 3B shows a line distribution along one diameter of the processing mark. The large sine curve in the line distribution indicates a surface undulation, and the distribution shows the formation of a step-like groove corresponding to the processing mark. The diameter of the processing mark was 9 mm, the processing depth was 40-100 nm, and the processing amount per revolution was 0.08 to 0.21 nm/revolution. It had been confirmed that the wafer sample cannot be processed when the sample stage 4 is rotated in the same manner but before filling the HF solution into the processing vessel 3.

The experiment shows that SiC, which is difficult to process by chemical etching, can be easily processed by the present processing method. Further, since the wafer sample was processed only beneath the catalyst having a base surface, the base surface is considered to have been transferred to the processing surface of the sample. The experiment thus demonstrates the effectiveness of the novel catalyst-aided chemical processing method of the present invention.

FIGS. 4A through 6D show the results of observation of the SiC wafer surface, before and after processing, by the Michelson-type phase-shifting interference microscope and an AFM (atomic force microscope).

Figure 4A:
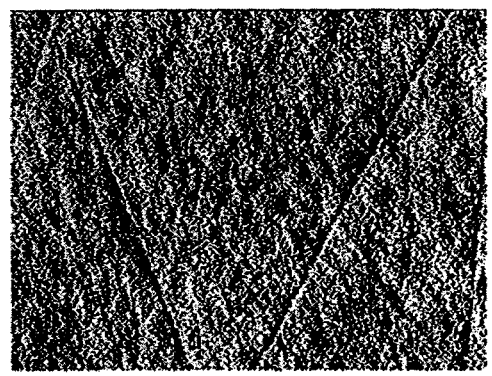
FIGS. 4A through 4D show the results of observation of an SiC wafer surface before processing, FIG. 4A showing the results of observation of a 64 µm×48 µm area with a Michelson-type phase-shifting interference microscope, FIG. 4B showing a line distribution in the center of FIG. 4A, FIG. 4C showing the results of observation with an AFM of a 500 nm×500 nm area, and FIG. 4D showing a Raw profile of FIG. 4C.
Figure 4B:
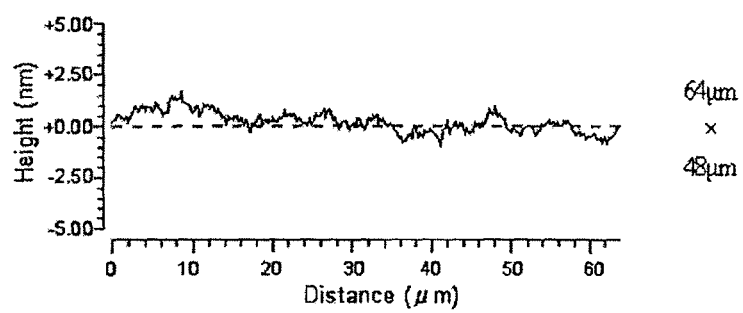
Figure 4C:
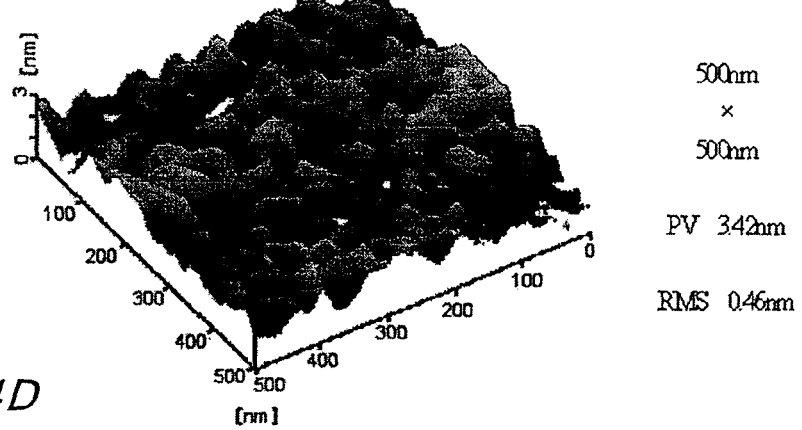
Figure 4D:
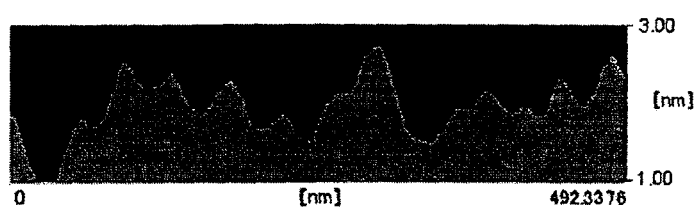

FIGS. 4A through 4D show the results of observation of the SiC wafer surface before processing, FIG. 4A showing the results of observation of a 64 µm×48 µm area with the Michelson-type phase-shifting interference microscope, FIG. 4B showing a line distribution in the center of FIG. 4A, FIG. 4C showing the results of observation with the AFM of a 500 nm×500 nm area, and FIG. 4D showing a Raw profile of FIG. 4C.

Figure 5A:
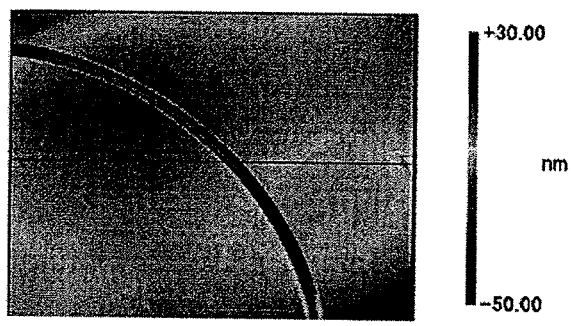
FIG. 5A through 5D show the results of observation of a processing mark, FIG. 5A showing the results of observation with the Michelson-type phase-shifting interference microscope, FIG. 5B showing a line distribution in the center of FIG. 5A, FIG. 5C showing an enlarged view of the square area shown in FIG. 5A, and FIG. 5D showing a line distribution in the center of FIG. 5C.
Figure 5B:
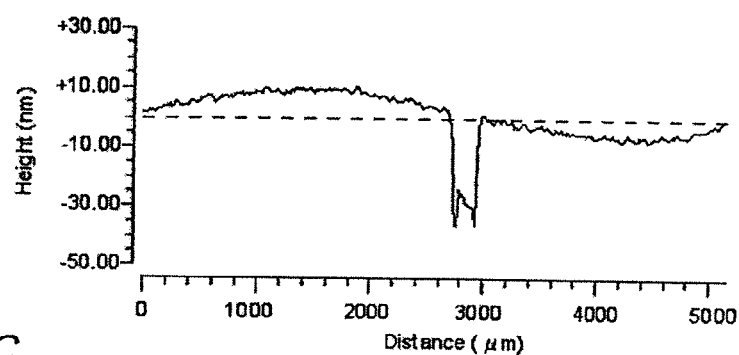
Figure 5C:
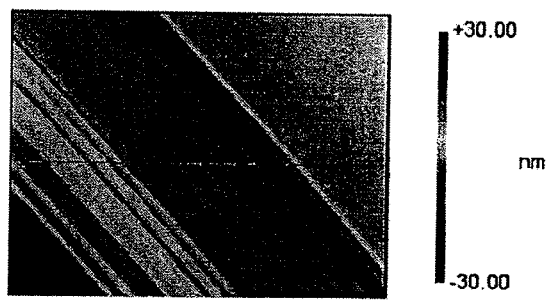
Figure 5D:
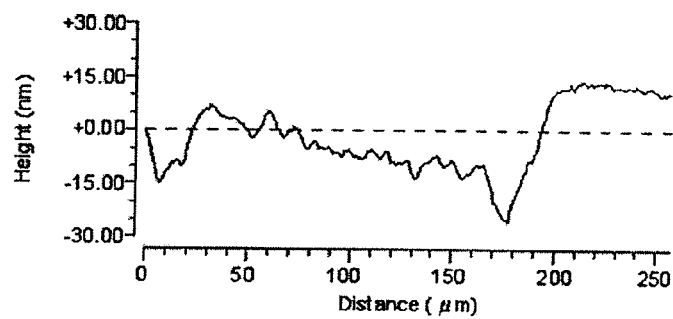

FIG. 5A through 5D show the results of observation of the processing mark, FIG. 5A showing the results of observation with the Michelson-type phase-shifting interference microscope, FIG. 5B showing a line distribution in the center of FIG. 5A, FIG. 5C showing an enlarged view of the square area shown in FIG. 5A, and FIG. 5D showing a line distribution in the center of FIG. 5C.

Figure 6A:
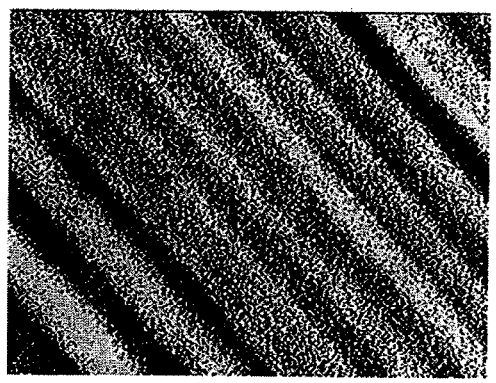
FIGS. 6A through 6D show the results of observation of the SiC wafer surface after processing, FIG. 6A showing the results of observation of a 64 µm×48 µm area with the Michelson-type phase-shifting interference microscope, FIG. 6B showing a line distribution in the center of FIG. 6A, FIG. 6C showing the results of observation with the AFM of a 500 nm×500 nm area, and FIG. 6D showing a Raw profile of FIG. 6C.
Figure 6B:
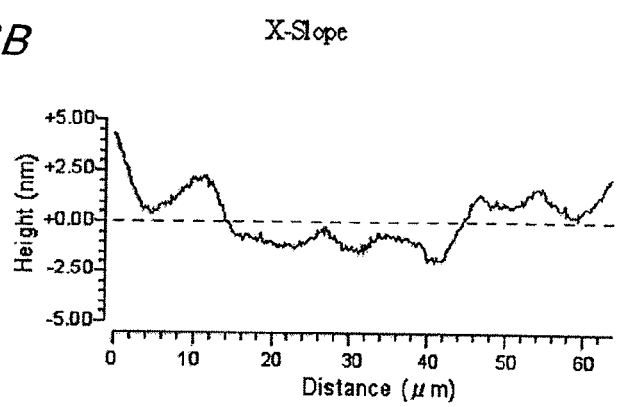
Figure 6C:
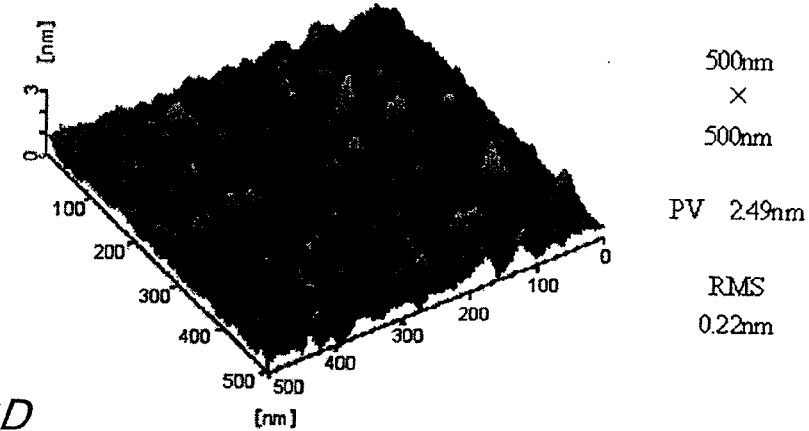
Figure 6D:
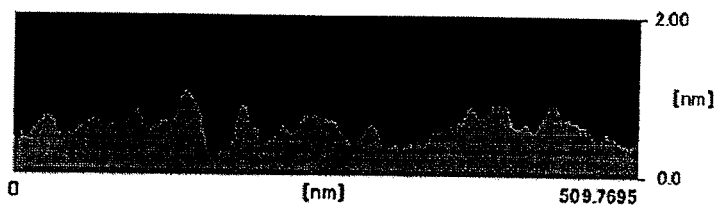

FIGS. 6A through 6D show the results of the same observation as FIGS. 4A through 4D of the square area shown in FIG. 5C. Thus, FIGS. 6A through 6D show the results of observation of the processed portion after processing of the SiC wafer, FIG. 6A showing the results of observation of a 64 µm×48 µm area with the Michelson-type phase-shifting interference microscope, FIG. 6B showing a line distribution in the center of FIG. 6A, FIG. 6C showing the results of observation with the AFM of a 500 nm×500 nm area, and FIG. 6D showing a Raw profile of FIG. 6C.

The results of observation with the Michelson-type phase-shifting interference microscope show large irregularities on the SiC wafer surface after processing. This is considered to be due to transfer of the original surface irregularities upon the processing with the platinum wire. This fact demonstrates transferability of a base surface according to the present invention and poses no problem because flattening is not under consideration at present.

Figure 7:
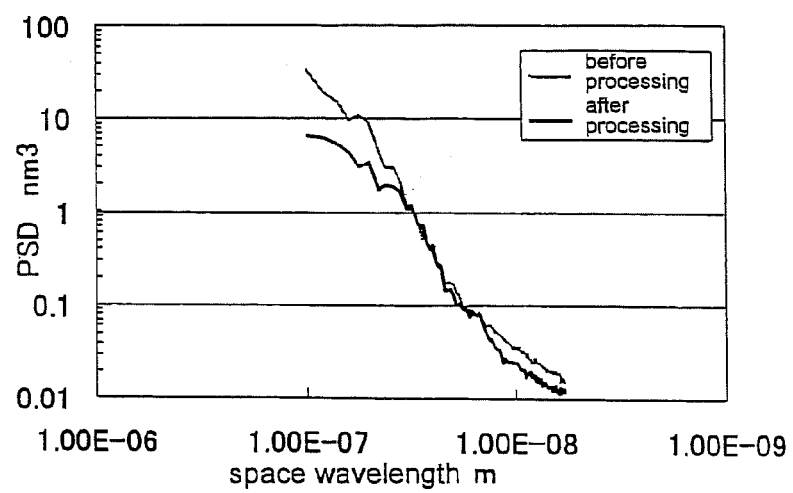
FIG. 7 is a graph showing the results of PSD analysis.

FIG. 7 shows the results of PSD analysis of the AFM data on the SiC wafer surface, before and after processing, in the 500 nm×500 nm area. As can be seen from the results of PSD analysis, the SiC surface was flattened by the processing in a space wavelength range of 10 nm to 100 nm. Flattening can be expected also in an intermediate wavelength range and in a low-frequency range.

Figure 8:
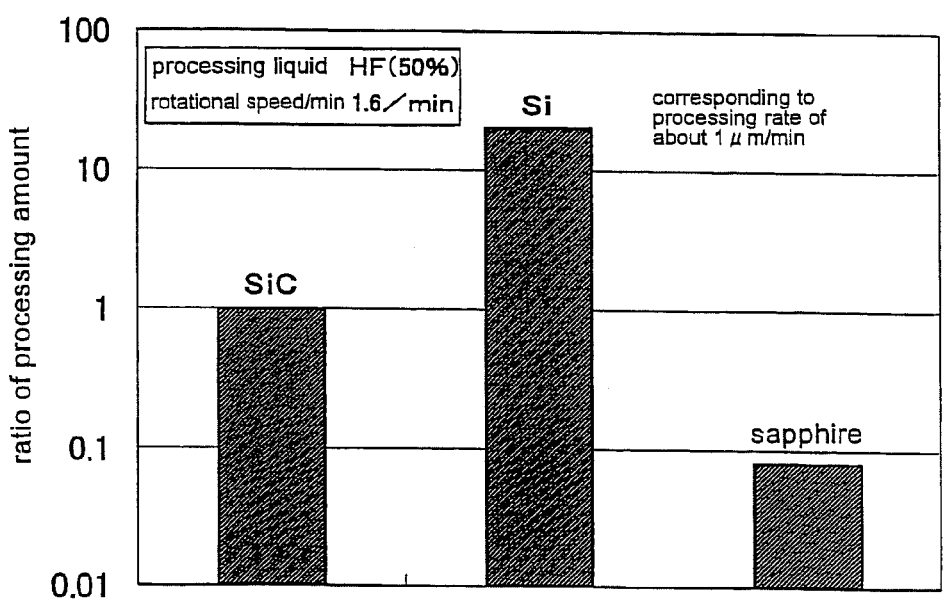
FIG. 8 is a graph showing comparison of the processing amount between SiC, Si and sapphire.

In order to examine what materials other than SiC can be processes, wafer samples of Si, sapphire, etc. were subjected to the same processing experiment. The results are shown in FIG. 8. Since the above-described processing apparatus is one adapted for basic experiment, the diameter of a circular processing mark, contact between the catalyst and a test sample, etc. can vary between samples tested, and therefore quantitative comparison of the processing amount between samples is difficult. However, qualitative comparison is possible. Accordingly, taking the processing amount per revolution in processing of SiC with the Pt catalyst as 1, the processing amount was evaluated for Si and sapphire. Further, the same processing experiment was carried out but using an Au catalyst instead of the Pt catalyst, and the same evaluation of the processing amount was conducted.

As is apparent from the results, Si can be processed more easily than SiC. Sapphire also can be processed. The fact that sapphire can be processed indicates that the processing according to the present invention is not effected through oxidation.

Figure 9:
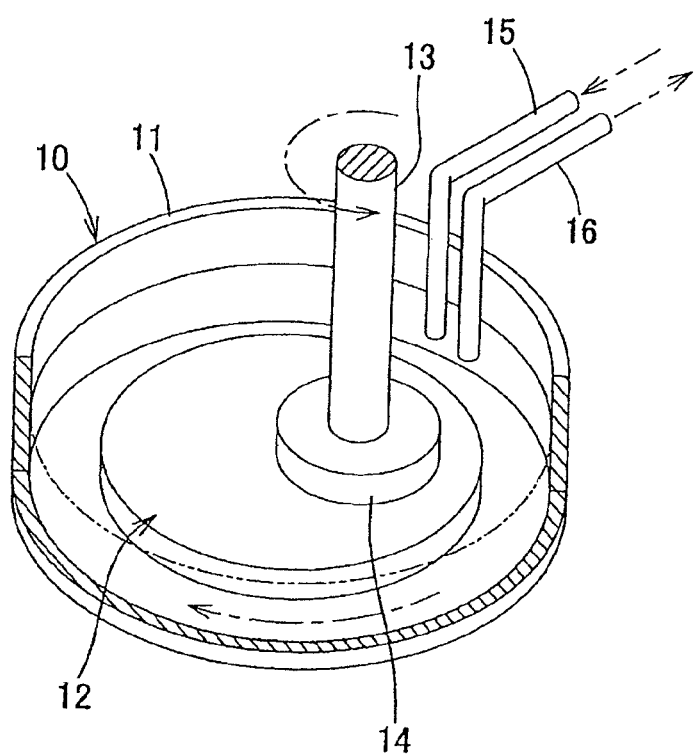
FIG. 9 is a schematic perspective view of a polishing apparatus.

FIG. 9 shows a schematic perspective view of a polishing apparatus. The polishing apparatus 10 includes a vessel 11, a rotatable platen 12, provided in the vessel 11, whose surface is composed of a material having a catalytic action, such as Pt, and a holder 14 provided at the front end of a rotating shaft 13 which is provided parallel and eccentrically to the axis of rotation of the platen 12. Further, the polishing apparatus 10 is provided with a processing solution circulation system in which an HF solution as a processing solution is filled into the vessel 11, the processing solution is recovered through a recovery pipe 16 while it is supplied from a supply pipe 15, the recovered processing solution is purified with a not-shown processing solution purifier, and the purified processing solution is re-supplied from the supply pipe 15. In operation, a workpiece is fixed to the holder 14 and the processing surface of the workpiece is brought close to or into slight contact with the platen 12, and the processing surface is processed into a flat surface by rotating the platen 12 and the holder 14. It is possible to provide a net-like or spiral groove structure in the surface of the platen 12 so that a fresh processing liquid can be supplied to the processing zone as the platen 12 rotates.

Figure 10A:
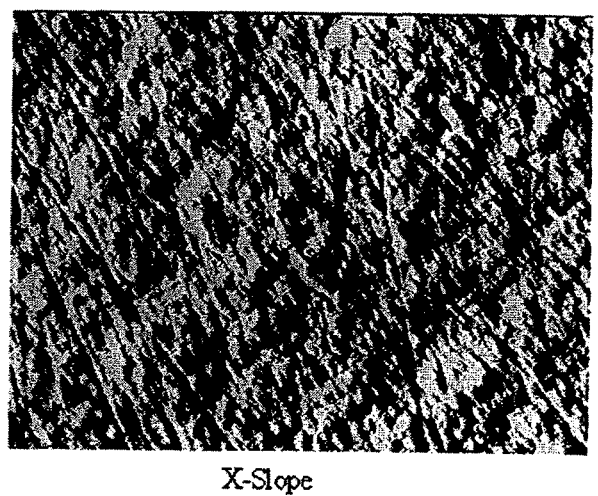
FIGS. 10A and 10B show the surface state of a 4H—SiC (0001) sample before processing, FIG. 10A showing an X-slope profile and FIG. 10B showing a Raw profile.
Figure 10B:
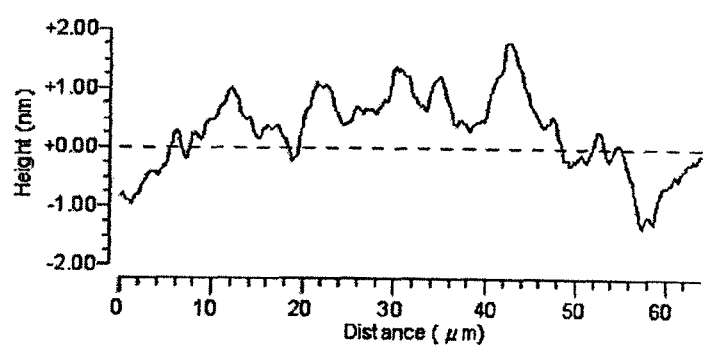
Figure 11A:
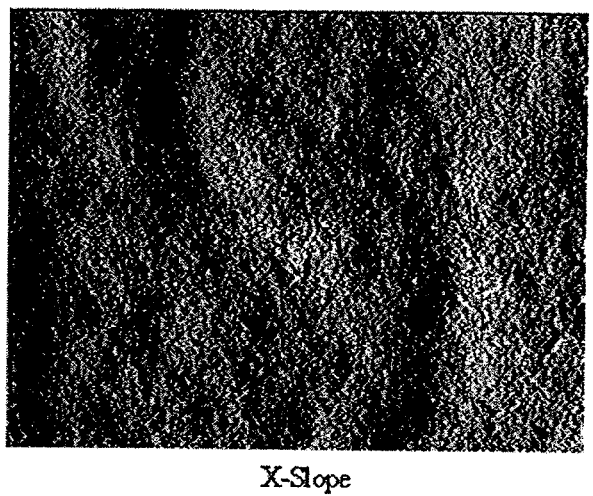
FIGS. 11A and 11B show the surface state of the 4H-Di (0001) sample after flattening processing, FIG. 11A showing an X-slope profile and FIG. 11B showing a Raw profile.
Figure 11B:
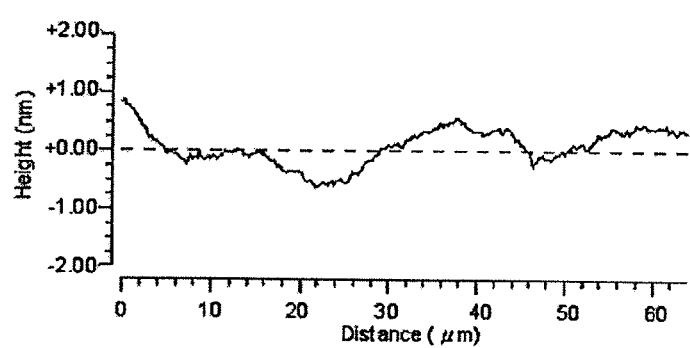

Flattening processing was carried out by using Pt as a surface material for the platen 12, a 10% HF solution as the processing solution, and 4H—SiC (0001) as a processing sample. FIGS. 10A and 10B show the surface state of the sample before processing, and FIGS. 11A and 11B show the surface state of the sample after processing. Flattening of the processing surface as shown in FIG. 11, i.e. removal of scratches and reduction in roughness, was attained in 30 minutes of processing.

As shown in FIGS. 12A and 12B, it is possible to utilize the lower surface of a catalyst 31 as a processing base surface to transfer the configuration or pattern of the base surface to the processing surface 32 of a workpiece. The Figures illustrate the case of forming a groove 34, corresponding to the shape of the rectangular catalyst 31, in the processing surface 32 of the workpiece. A layer of catalyst, facing a processing surface, could sufficiently function as a processing base surface. Accordingly, a film-forming technique, such as plating or vapor deposition, can be applied to form a processing base surface. When a pattern is formed on the processing base surface of a catalyst, a raised portion of the pattern can be transferred as a recess to the processing surface of a workpiece. This could be utilized in the manufacturing of semiconductor devices.

Though not shown diagrammatically, it is also possible to use a processing tool comprising a synthetic resin base and a plating or coating film of catalyst provided on a surface of the synthetic resin base, a processing tool comprising a mixture of a synthetic resin base and a powdery catalyst, with part of the powdery catalyst being exposed on a surface of the synthetic resin base, a processing tool comprising a non-woven fabric and a powdery catalyst carried in the interstices of the non-woven fabric, a processing tool comprising a non-woven fabric composed of fibers plated or coated with a catalyst, etc. Polishing or lapping of a processing surface of a workpiece can be carried out by moving such a processing tool relative to the processing surface.

Further, it is possible to carry out similar processing to EEM by dispersing a powdery catalyst in a processing solution and supplying the powdery catalyst to a processing surface of a workpiece with a flow of the processing solution. The processing solution, dispersed the powdery catalyst therein, can be supplied to the processing surface of the workpiece by using supply means conventionally employed in EEM, in particular a rotating ball or a high-pressure nozzle.

What is claimed is:

1. A catalyst-aided chemical processing apparatus for polishing an SiC wafer comprising:
    a rotatable platen including a synthetic resin base and a plating or coating film formed on the synthetic resin, the plating or coating film having a processing base surface consisting of a platinum, gold or ceramic solid catalyst;
    a rotational shaft provided parallel and eccentrically to the axis of rotation of the platen;
    a holder, provided at a front end of the rotational shaft, for holding the SiC wafer and bringing a surface of the SiC wafer close to or into contact with the processing base surface of the platen while rotating the SiC wafer; and
    a processing solution supply portion for supplying a processing solution, in which a halogen-containing molecule is dissolved, to between the processing base surface of the platen and the surface of the SiC so that a halogen radical is generated at the processing base surface by dissociating the halogen-containing molecule,
    wherein the processing solution supply portion includes a vessel for holding the processing solution and immersing the platen in the processing solution, and a supply pipe for supplying the processing solution to the vessel.

2. The catalyst-aided chemical processing apparatus according to claim 1, wherein the halogen-containing molecule is hydrogen halide, and the hydrogen halide is dissociated at the processing base surface to generate the halogen radical.

3. The catalyst-aided chemical processing apparatus according to claim 2, wherein the hydrogen halide is hydrogen fluoride or hydrogen chloride.

4. The catalyst-aided chemical processing apparatus according to claim 1, wherein the processing base surface has a net-like or spiral groove structure.

* * * * *